US009825148B2

(12) United States Patent
Meiser et al.

(10) Patent No.: US 9,825,148 B2
(45) Date of Patent: Nov. 21, 2017

(54) SEMICONDUCTOR DEVICE COMPRISING AN ISOLATION TRENCH

(71) Applicant: Infineon Technologies AG, Neubiberg (DE)

(72) Inventors: Andreas Meiser, Sauerlach (DE); Till Schloesser, Munich (DE); Thorsten Meyer, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/160,525

(22) Filed: May 20, 2016

(65) Prior Publication Data

US 2016/0268397 A1    Sep. 15, 2016

Related U.S. Application Data

(60) Continuation of application No. 14/794,898, filed on Jul. 9, 2015, now Pat. No. 9,349,834, which is a (Continued)

(51) Int. Cl.
*H01L 29/66* (2006.01)
*H01L 29/78* (2006.01)
(Continued)

(52) U.S. Cl.
CPC .. *H01L 29/66704* (2013.01); *H01L 21/28008* (2013.01); *H01L 21/76* (2013.01);
(Continued)

(58) Field of Classification Search
CPC . H01L 21/28008; H01L 21/76; H01L 27/088; H01L 29/404; H01L 29/407; H01L 29/66659; H01L 29/66704; H01L 29/66734; H01L 29/7835; H01L 21/823487; H01L 29/7813
(Continued)

(56) References Cited

U.S. PATENT DOCUMENTS 4,963,505 A    10/1990  Fujii et al.
6,353,252 B1    3/2002  Yasuhara et al.
(Continued)

FOREIGN PATENT DOCUMENTS

CN     1149203 A     5/1997
CN    101364613 A     2/2009
(Continued)

*Primary Examiner* — Shahed Ahmed
(74) *Attorney, Agent, or Firm* — Murphy, Bilack & Homiller, PLLC

(57) ABSTRACT

A method of manufacturing a semiconductor device includes forming a transistor in a semiconductor substrate having a first main surface. The transistor is formed by forming a source region, forming a drain region, forming a channel region, forming a drift zone, and forming a gate electrode adjacent to at least two sides of the channel region. The channel region and the drift zone are disposed along a first direction parallel to the first main surface, between the source region and the drain region. Forming the semiconductor device further includes forming a conductive layer, a portion of the conductive layer being disposed beneath the gate electrode and insulated from the gate electrode.

15 Claims, 12 Drawing Sheets

Related U.S. Application Data division of application No. 14/027,570, filed on Sep. 16, 2013, now Pat. No. 9,123,801.

(51) Int. Cl.

| | | |
|---|---|---|
| *H01L 21/28* | (2006.01) | |
| *H01L 29/40* | (2006.01) | |
| *H01L 21/76* | (2006.01) | |
| *H01L 27/088* | (2006.01) | |
| *H01L 21/8234* | (2006.01) | |

(52) U.S. Cl.
CPC .......... *H01L 27/088* (2013.01); *H01L 29/404* (2013.01); *H01L 29/407* (2013.01); *H01L 29/66659* (2013.01); *H01L 29/66734* (2013.01); *H01L 29/7813* (2013.01); *H01L 29/7835* (2013.01); *H01L 21/823487* (2013.01)

(58) Field of Classification Search
USPC ........ 257/288, 367, 369, 330, 520; 438/151, 438/197, 199, 259, 270
See application file for complete search history.

(56) References Cited

U.S. PATENT DOCUMENTS

| | | | |
|---|---|---|---|
| 7,638,841 | B2 | 12/2009 | Challa |
| 7,723,783 | B2 | 5/2010 | Saito et al. |
| 8,575,695 | B2 | 11/2013 | Bobde et al. |
| 8,847,311 | B2 | 9/2014 | Meiser et al. |
| 2003/0141514 | A1 | 7/2003 | Yamaguchi et al. |
| 2003/0209757 | A1 | 11/2003 | Henninger et al. |
| 2004/0173846 | A1 | 9/2004 | Hergenrother et al. |
| 2006/0113625 | A1 | 6/2006 | Bude et al. |
| 2008/0012067 | A1 | 1/2008 | Wu |
| 2009/0086523 | A1* | 4/2009 | Hartwich ............... H01L 27/105 365/72 |
| 2009/0184352 | A1 | 7/2009 | Yamaguchi et al. |
| 2009/0242981 | A1 | 10/2009 | Fujita et al. |
| 2010/0200915 | A1 | 8/2010 | Denison |
| 2012/0009740 | A1 | 1/2012 | Cheng et al. |
| 2012/0286355 | A1 | 11/2012 | Mauder et al. |
| 2013/0049074 | A1 | 2/2013 | Surthi et al. |
| 2013/0126967 | A1 | 5/2013 | Toyoda et al. |
| 2013/0249602 | A1 | 9/2013 | Mauder et al. |
| 2013/0341717 | A1* | 12/2013 | Chen ................. H01L 29/66659 257/337 |
| 2014/0084362 | A1 | 3/2014 | Schloesser et al. |
| 2014/0151798 | A1 | 6/2014 | Meiser et al. |
| 2014/0151804 | A1 | 6/2014 | Meiser et al. |
| 2014/0220761 | A1 | 8/2014 | Molloy et al. |
| 2014/0252494 | A1 | 9/2014 | Lui et al. |
| 2015/0118814 | A1* | 4/2015 | Ng ........................ H01L 29/407 438/283 |

FOREIGN PATENT DOCUMENTS

| | | |
|---|---|---|
| CN | 102130157 A | 7/2011 |
| CN | 102315250 A | 1/2012 |
| CN | 102412299 A | 4/2012 |
| CN | 103165604 A | 6/2013 |
| CN | 103367361 A | 10/2013 |
| WO | 2013128833 A1 | 9/2013 |

* cited by examiner

SEMICONDUCTOR DEVICE COMPRISING AN ISOLATION TRENCH

BACKGROUND

Power transistors commonly employed in automotive and industrial electronics require a low on-state resistance ($R_{on}$), while securing a high voltage blocking capability. For example, a MOS ("metal oxide semiconductor") power transistor should be capable, depending upon application requirements to block drain to source voltages $V_{ds}$ of some tens to some hundreds or thousands of volts. MOS power transistors typically conduct very large currents which may be up to some hundreds of Amperes at typical gate-source voltages of about 2 to 20 V.

Lateral power devices, in which current flow mainly takes place parallel to a first main surface of a semiconductor substrate, are useful for integrated circuits in which further components, such as switches, bridges and control circuits are integrated.

According to existing technologies, there are integration schemes which combine processes of manufacturing a vertical power device comprising a trench with further components such as logic circuits. Generally, a field plate is disposed in a lower portion of the trench, and a gate electrode is disposed in an upper portion of the trench. In such vertical power devices, a current flow mainly takes place perpendicularly with respect to the first main surface of the semiconductor substrate.

There is need of developing further lateral transistor concepts which may be manufactured utilizing known integration schemes.

SUMMARY

According to an embodiment, a semiconductor device comprises a transistor in a semiconductor substrate having a first main surface. The transistor includes a source region, a drain region, a channel region, a drift zone, and a gate electrode adjacent to at least two sides of the channel region, the channel region and the drift zone being disposed along a first direction parallel to the first main surface, between the source region and the drain region. The semiconductor device further comprising a conductive layer beneath the gate electrode and insulated from the gate electrode.

According to another embodiment, an integrated circuit comprises a first transistor and a second transistor in a semiconductor substrate having a first main surface. The first transistor includes a first source region, a first drain region, a first channel region, a first drift zone, a first gate electrode adjacent to at least two sides of the first channel region, the first channel region and the first drift zone being disposed along a first direction parallel to the first main surface between the first source region and the first drain region. The second transistor comprises a second source region, a second drain region, a second channel region, a second drift zone, a second gate electrode, and a second field plate adjacent to the second drift zone. The second channel region and the second drift zone are disposed along a second direction between the second source region and the second drain region, the second direction extending perpendicularly with respect to the first main surface.

According to a further embodiment, a method of manufacturing a semiconductor device includes forming a transistor a semiconductor substrate having a first main surface. Forming the transistor comprises forming a source region, forming a drain region, forming a channel region, forming a drift zone, and forming a gate electrode adjacent to at least two sides of the channel region. The channel region and the drift zone are disposed along a first direction parallel to the first main surface, between the source region and the drain region. Forming the semiconductor device further includes forming a conductive layer, a portion of the conductive layer being disposed beneath the gate electrode and insulated from the gate electrode.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

DETAILED DESCRIPTION

Figure 1:
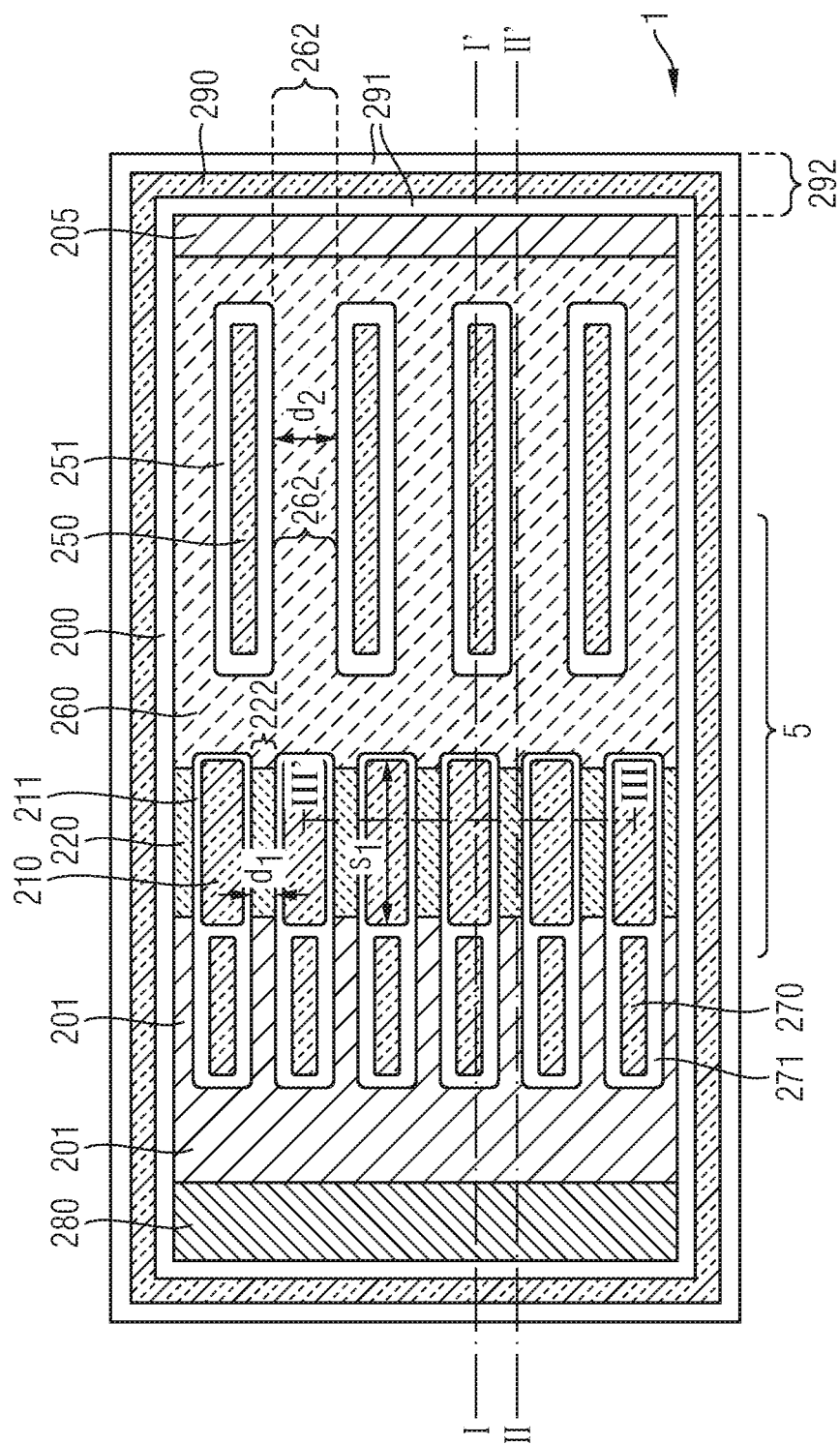
FIG. 1 shows a cross-sectional view of a semiconductor device according to an embodiment, the cross-sectional view being taken parallel to a first main surface of a semiconductor substrate.

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The Figures and the description illustrate relative doping concentrations by indicating "−" or "+" next to the doping type "n" or "p". For example, "n$^−$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

FIG. 1 shows a cross-sectional view of a semiconductor device 1 according to an embodiment. The cross-sectional view of FIG. 1 is taken along a plane that is parallel to a first main surface of a semiconductor substrate. The semiconductor device 1 shown in FIG. 1 comprises a source region 201, a drain region 205, a channel region 220, and a drift zone 260. The source region 201, the drain region 205, and the drift zone 260 may be doped with dopants of a first conductivity type, for example n-type dopants. The doping concentration of the source and drain regions 201, 205 may be higher than the doping concentration of the drift zone 260. The channel region 220 is arranged between the source region 201 and the drift zone 260. The channel region 220 is doped with the dopants of a second conductivity type, for example, p-type dopants. The drift zone 260 may be arranged between the channel region 220 and the drain region 205. The source region 201, the channel region 220, the drift zone 260 and the drain region 205 are disposed along a first direction parallel to a first main surface of the semiconductor substrate.

When a suitable voltage is applied to the gate electrode 210, the conductivity of a channel that is formed in the channel region 220 is controlled by the gate voltage. The gate electrode 210 is insulated from the channel region 220 by means of an insulating gate dielectric material 211 such as silicon oxide. By controlling the conductivity of the channel formed in the channel region 220, the current flow from the source region 201 via the channel formed in the channel region 220 and the drift zone 260 to the drain region 205 may be controlled. According to an embodiment, the transistor may further comprise a field plate 250 which is arranged adjacent to the drift zone 260. The field plate 250 is insulated from the drift zone 260 by means of an insulating field dielectric layer 251 such as silicon oxide.

As has been mentioned above, when the transistor is switched on, an inversion layer is formed at the boundary between the channel region 220 and the insulating gate dielectric material 211. Accordingly, the transistor is in a conducting state from the source region 201 to the drain region 205 via the drift zone 260. When the transistor is switched off, no conductive channel is formed at the boundary between the channel region 220 and the insulating gate dielectric material 211 so that no current flows. Further, an appropriate voltage may be applied to the field plate 250 in an off-state. In an off-state, the field plate 250 depletes charge carriers from the drift zone 260 so that the breakdown voltage characteristics of the semiconductor device 1 are improved. In a semiconductor device 1 comprising a field plate 250, the doping concentration of the drift zone 260 may be increased without deteriorating the breakdown voltage characteristics in comparison to a device without a field plate. Due to the higher doping concentration of the drift zone 260, the on-resistance $RDS_{on}$ is further decreased resulting in improved device characteristics.

The semiconductor device 1 may further comprise a body contact region 280 which may be doped with the second conductivity type. Further, the semiconductor device 1 comprises an isolation trench 292 that surrounds the array of lateral transistors. An insulating material 291 is disposed at the sidewalls of the isolation trench 292. Further, a conductive filling 290 is disposed within the isolation trench 292.

Figure 2:
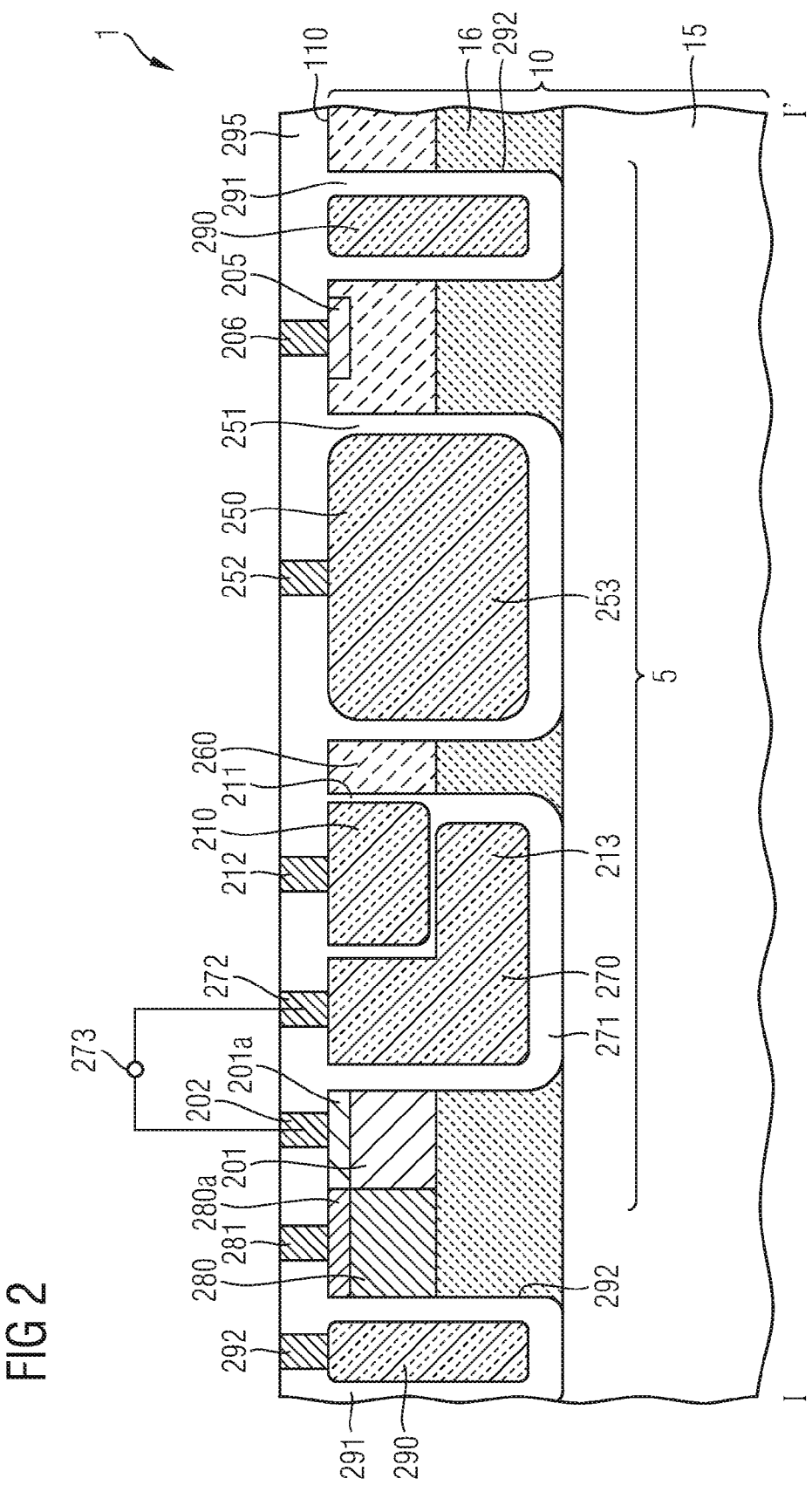
FIG. 2 shows a cross-sectional view of the semiconductor device illustrated in FIG. 1.

FIG. 2 illustrates a cross-sectional view of the semiconductor device 1 along the line labelled I and I' in FIG. 1. The cross-sectional view of FIG. 2 is taken so as to intersect the gate electrode 210 and the field plate 250. The semiconductor device 1 is formed in a semiconductor substrate 10 comprising a base layer 15 which may be, for example, doped with the first conductivity type, for example n$^+$, superposed by a region of the first conductivity type at a lower doping concentration. A portion 16 of the substrate material doped with dopants of the second conductivity type is disposed over the base layer 15. Correspondingly doped substrate portions and wells are formed so as to provide the source region 201 including a heavily doped region 201a that is in contact with the source electrode 202. Further, the body contact region 280 comprises a heavily doped region 280a that is in contact with the body contact plug 281. The body contact portion 280 connects the channel region 220 to an appropriate potential such as the source potential so as to avoid a parasitic bipolar transistor which could be otherwise formed at this portion.

The gate electrode 210 is disposed in a gate trench 213. The gate trench 213 is disposed in the first main surface 110 of the semiconductor substrate 10 until a bottom side of the layer 16. Further, the field plate 250 is disposed in a field plate trench 253 which may extend to the same depth as the gate electrode trench 213. The isolation trench 292 may extend to the same depth as the gate trench 213 and the field plate trench 253. The material 290 filled in the isolation trench 292 may be the same material as the material of the field plate 250 and the material 270 that is disposed in the semiconductor substrate 10 beneath the gate electrode 210.

A conductive material 270 is disposed in the gate trenches 213. A portion of the conductive material 270 is disposed in the semiconductor substrate 10 beneath the gate electrode 210 and is insulated from the gate electrode 210 by the insulating material 211 and from the surrounding semiconductor material by insulating material 271. According to an embodiment, a portion of the conductive layer 270 is disposed adjacent to the first main surface 110. The conductive layer 270 is coupled via a connection plug 272 to an appropriate potential. Thereby, a parasitic MOS transistor may be avoided which otherwise could be formed at this position. For example, the conductive layer 270 may be coupled to the source terminal 273. The drain region 205 may be coupled to a drain electrode 206.

Figure 3A:
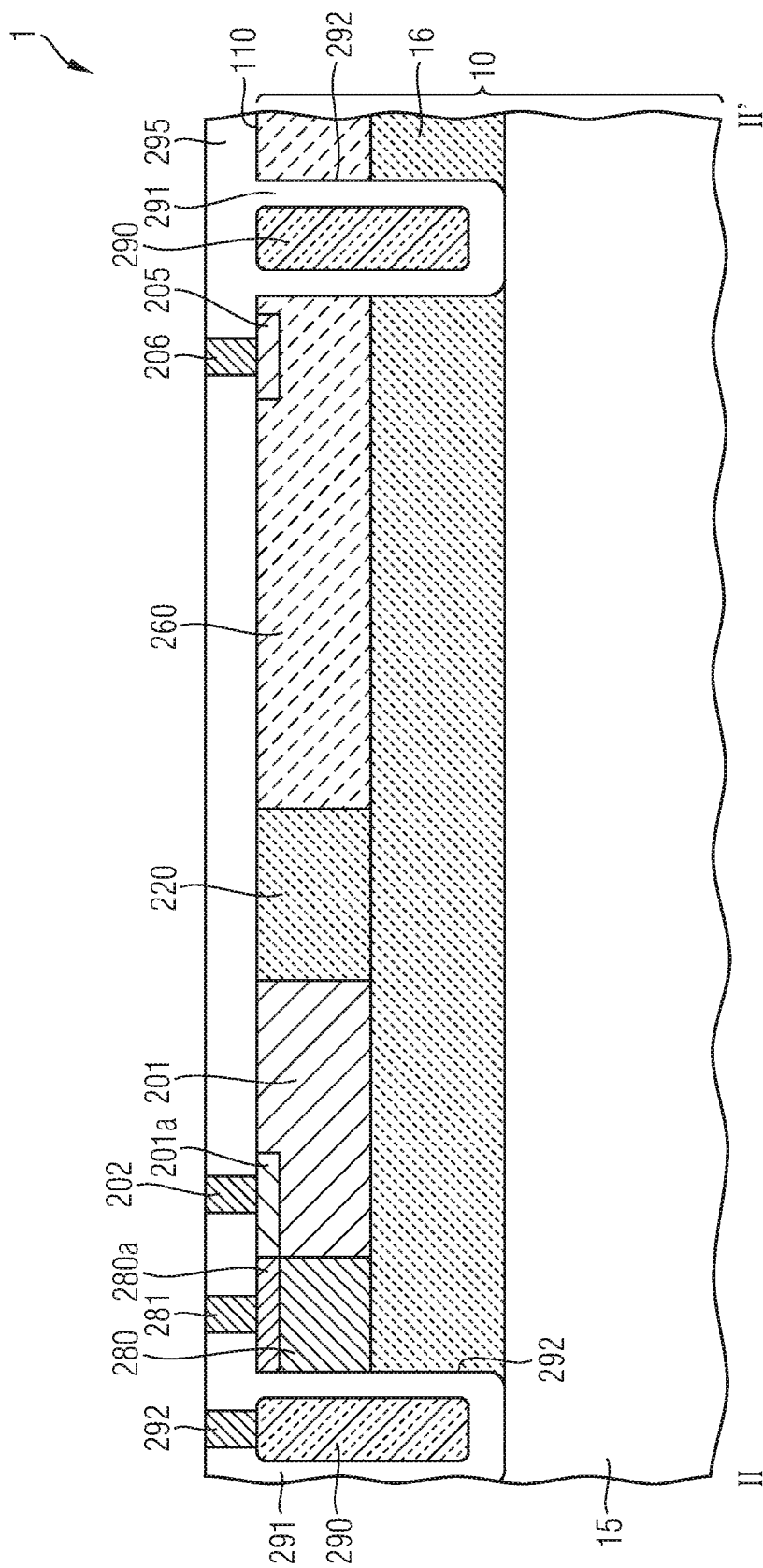
FIGS. 3A and 3B illustrate further cross-sectional views of the semiconductor device shown in FIG. 1.

FIG. 3A shows a further cross-sectional view of the semiconductor device along the line labelled II and II' in FIG. 1. The cross-sectional view of FIG. 3A is taken so as to intersect the channel region 220 and the drift zone 260.

As is shown in FIG. 3A, the body contact region 280 extends in a third direction which is parallel to the first main surface 110 and perpendicularly with respect to the first direction. Likewise, the source region 201 extends along the third direction. A portion of the source region 201 is disposed between sections of the conductive layer 270 disposed in the gate trenches 213. The channel region 220 is disposed between adjacent portions of the gate electrode 210. The channel region 220 comprises a doped substrate portion that is doped with the second conductivity type. The drift zone 260 is disposed between adjacent field plate trenches 253.

Figure 3B:
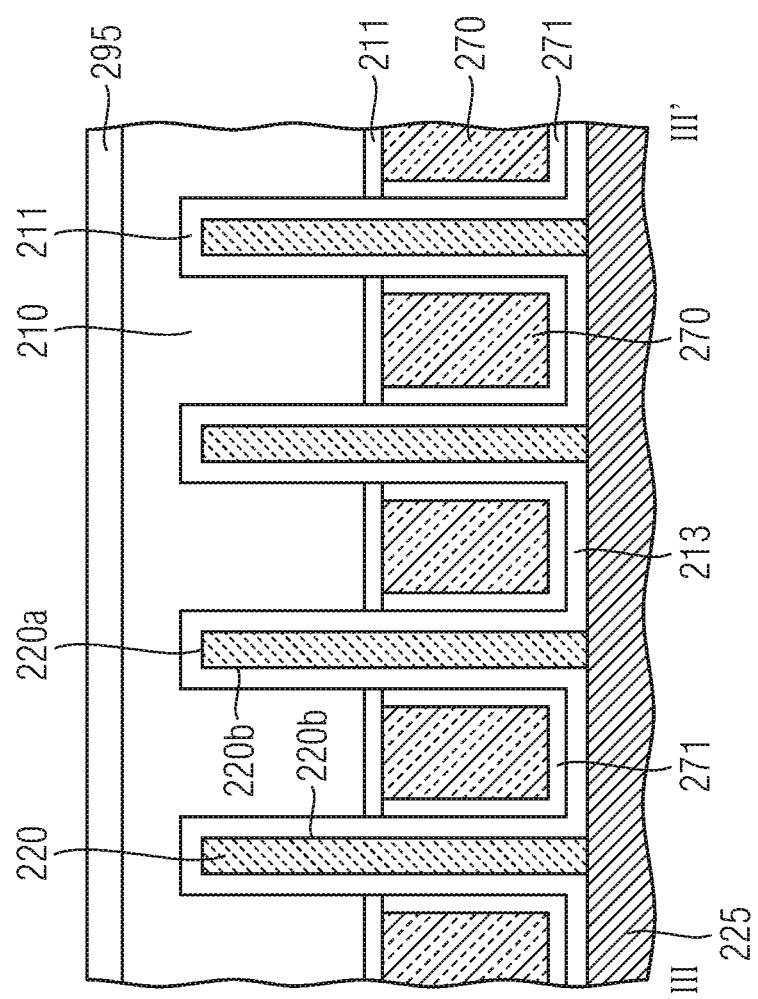

FIG. 3B shows a cross-sectional view of the semiconductor device along the line labelled III and III' in FIG. 1, in a direction that is perpendicular with respect to the direction between I and I' or II and II', respectively. As is shown in FIG. 3B, the channel region 220 has the shape of a ridge, the ridge having a width d1. For example, the ridge may have a top side 220a and two sidewalls 220b. The sidewalls 220b may extend perpendicularly or at an angle of more than 75° with respect to the main surface 110. According to the embodiment shown in FIG. 3, the gate electrode 210 may be disposed adjacent to at least two sides of the ridge. Further, the gate electrode 210 may also be adjacent to the top side 220a of the ridge. According to another embodiment, the gate electrode 210 may be adjacent to only two sidewalls 220b of the ridge. As is further illustrated in FIG. 3B, the conductive material 270 is disposed in a lower portion of the gate trenches 213.

As has been illustrated with reference to FIGS. 1 to 3B, a semiconductor device 1 comprises a transistor 5 formed in a semiconductor substrate 10 having a first main surface 110. The transistor 5 comprises a source region 201, a drain region 205, a channel region 220, a drift zone 260, and a gate electrode 210 extending in a first direction parallel to the first main surface 110. The gate electrode 210 is disposed adjacent to at least two sides of the channel region 220, and the channel region 220 and the drift zone 260 are disposed along the first direction between the source region 201 and the drain region 205. The semiconductor device further comprises a conductive layer 270. A portion of the conductive layer 270 is disposed in the semiconductor substrate 10 beneath the gate electrode 210 and is insulated from the gate electrode 210. According to a further embodiment, the semiconductor device 1 may comprise a field plate 250 that is arranged adjacent to the drift zone 260.

Accordingly, the channel region 220 has a shape of a first ridge 222 that extends in the first direction. According to an embodiment, also the drift zone 260 may have a shape of a second ridge extending along the first direction. As is illustrated in FIG. 1, the second ridge 262 may have a width d2 that is different from the width d1 of the first ridge 222.

According to an embodiment, the width $d_1$ of the channel region 220 is $d_1 \leq 2 \times l_d$, wherein $l_d$ denotes a length of a depletion zone which is formed at the interface between the gate dielectric 211 and the channel region 220. For example, the width of the depletion zone may be determined as:

$$l_d = \sqrt{\frac{4\varepsilon_s kT \ln(N_A/n_i)}{q^2 N_A}}$$

where $\varepsilon_s$ denotes the permittivity of the semiconductor material (11.9×$\varepsilon_0$ for silicon, $\varepsilon_0$=8.85×10$^{-14}$ F/cm), k denotes the Boltzmann constant (1.38066×10$^{-23}$ J/k), T denotes the temperature, ln the denotes the natural logarithm, $N_A$ denotes the impurity concentration of the semiconductor body, $n_i$ denotes the intrinsic carrier concentration (1.45×10$^{10}$ cm$^{-3}$ for silicon at 27° C.), and q denotes the elementary charge (1.6×10$^{-19}$ C).

Generally, the length of the depletion zone varies depending from the gate voltage. It is assumed that in a transistor the length of the depletion zone at a gate voltage corresponding to the threshold voltage corresponds to the maximum width of the depletion zone. For example, the width of the first ridges may be approximately 20 to 130 nm, for example, 40 to 120 nm along the first main surface 110 of the semiconductor substrate 10.

Moreover, the ratio of length to width may fulfil the following relationship: $s_1/d_1 > 2.0$, where $s_1$ denotes the length of the first ridge in contact with the gate electrode 210, or, differently stated, the length of the channel region, measured along the first direction, as is also illustrated in FIG. 1. According to further embodiments, $s_1/d_1 > 2.5$. According to a further embodiment, the drift zone 260 may comprise a flat surface which is not patterned to form ridges.

According to the embodiment in which the width $d_1 \leq 2 \times l_d$, the transistor 200 is a so-called "fully-depleted" transistor in which the channel region 220 is fully depleted when the gate electrode 210 is set to an on-voltage. In such a transistor, an optimal sub-threshold voltage can be achieved and short channel effects may be efficiently suppressed, resulting in improved device characteristics.

In a transistor including a field plate 250, on the other hand, it is desirable to use a drift zone 260 having a width d2 which is much larger than the width d1. Due to the larger width of the drift zone d2, the resistance RDS$_{on}$ of the drift zone 260 may be further decreased, resulting in further improve device characteristics. In order to improve the characteristics of the semiconductor device in the body region and to further improve the device characteristics in the drift zone, patterning the gate electrode and the field plate may be accomplished using an appropriate etching mask so as to provide a different width of the first and second ridges.

As will be discussed particularly with reference to FIGS. 5A to 5H, the semiconductor device shown in FIGS. 1 to 3B may be implemented by an integration scheme for manufacturing a vertical power transistor, i.e. a power transistor in which the field plate 250 and the gate electrode 210 are implemented by two different conductive layers that are disposed in a trench that is formed in the first main surface 110 of the semiconductor substrate 10.

Figure 4A:
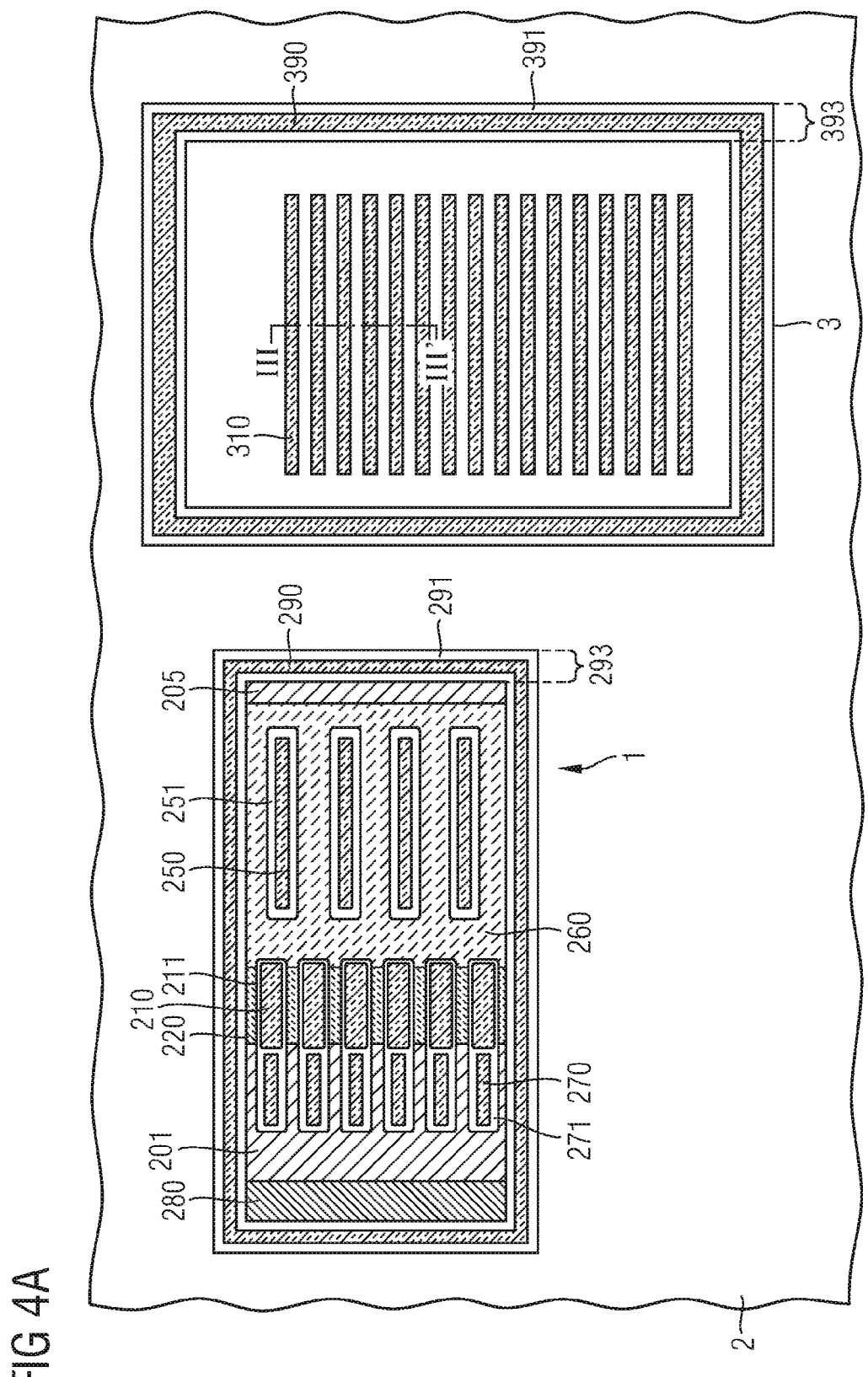
FIG. 4A shows a cross-sectional view of an integrated circuit, the cross-sectional view being taken along a plane parallel to a first main surface of a semiconductor substrate.

FIG. 4A shows a cross-sectional view of an integrated circuit according to an embodiment. The cross-sectional view of FIG. 4A is taken in a plane parallel to the first main surface of the semiconductor substrate. As is shown, an integrated circuit 2 according to an embodiment comprises a semiconductor device 1 as has been described herein above with reference to FIGS. 1 to 3. Further, the integrated circuit 2 includes a second semiconductor device 3 including vertical power transistors. As is specifically illustrated in FIG. 4A, the second semiconductor device 3 comprises a plurality of gate trenches 310 that run in a direction parallel to the first main surface of the semiconductor substrate. The semiconductor device 3 may further comprise an isolation trench 393 that encloses the array of gate trenches 310. An insulating layer 391 is disposed at sidewalls of the isolation trench 393. Further, a conductive filling 390 is disposed in the isolation trenches 393.

Figure 4B:
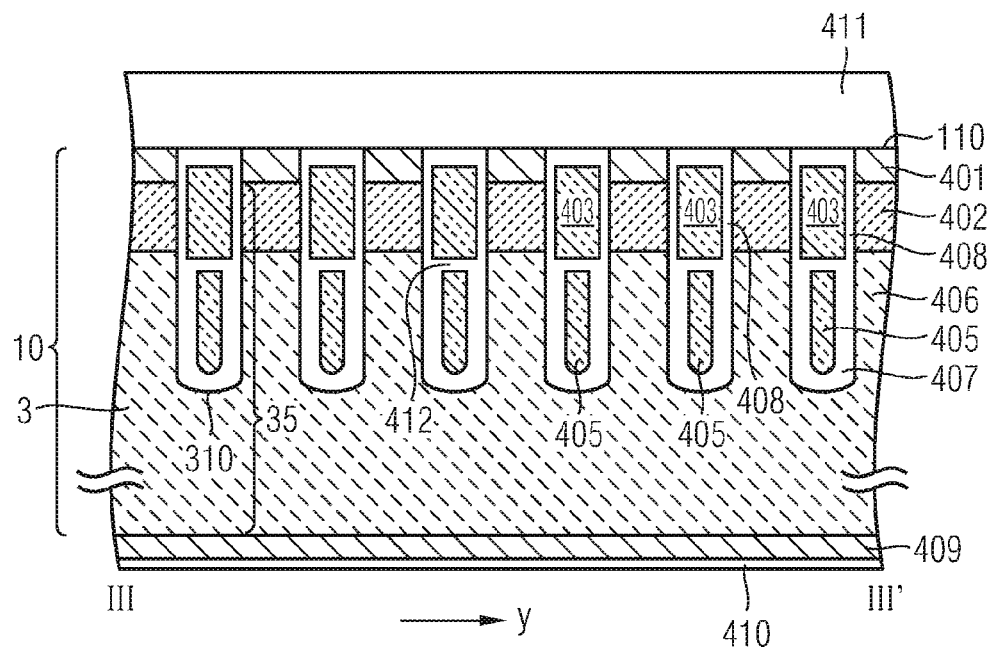
FIG. 4B shows a cross-sectional view of a portion of the integrated circuit shown in FIG. 4A.

FIG. 4B shows a cross-sectional view of the second semiconductor device 3 along the line labelled III and III' in FIG. 4A. The semiconductor device 3 comprises a plurality of vertical transistors 35 that may be connected in parallel. Each of the vertical transistors 35 includes a gate trench 310 formed in the first main surface 110 of the semiconductor substrate 10. The semiconductor device 3 includes a source region 401 that is disposed adjacent to the first main surface 110 and a drain region 409 that is disposed on a back side of the semiconductor substrate 10. A drain electrode 410 is disposed adjacent to the drain region 409. Further, the semiconductor device 3 comprises a channel region 402 and a drift zone 406 that are disposed between the source region 401 and the drain region 409 in a second direction that is perpendicular with respect to the first main surface 110. A field plate 405 is disposed in a lower portion of the gate trenches 310. Further, a gate electrode 403 is disposed in an upper portion of the trench 310 adjacent to the channel 402. The gate electrode 403 is insulated from the channel region 402 by means of a gate dielectric 408. Further, the field plate 405 is insulated from the drift zone 406 by means of a field dielectric layer 407. The gate electrode 403 is insulated from the field plate 405 by an insulating layer 412.

When an appropriate voltage is applied to the gate electrode 403, a conductive channel is formed as an interface between the channel region 402 and the gate dielectric layer 408. Accordingly, the gate voltage controls the current flow between source region 401 and drain region 409. When the transistor is switched off, no conductive channel is formed at the interface between the channel region 402 and the gate dielectric layer 408. Further, due to the presence of the field plate 405, charge carriers are depleted from the drift zone 406 so that the resulting transistor may withstand comparatively high voltages. According to an embodiment, both types of transistors, i.e. the lateral transistor 5 and the vertical transistor 35 may be integrated in a single semiconductor substrate 10. Further, both semiconductor devices may be formed by joint processing processes. For example, using different masks for the first semiconductor device 1 and the second semiconductor device 3, the respective components may be processed.

FIGS. 5A to 5H illustrate steps of manufacturing the semiconductor device 1 or the integrated circuit 2. FIGS. 5A to 5H specifically illustrate cross-sectional views along the line labelled I and I' in FIG. 1.

Figure 5A:
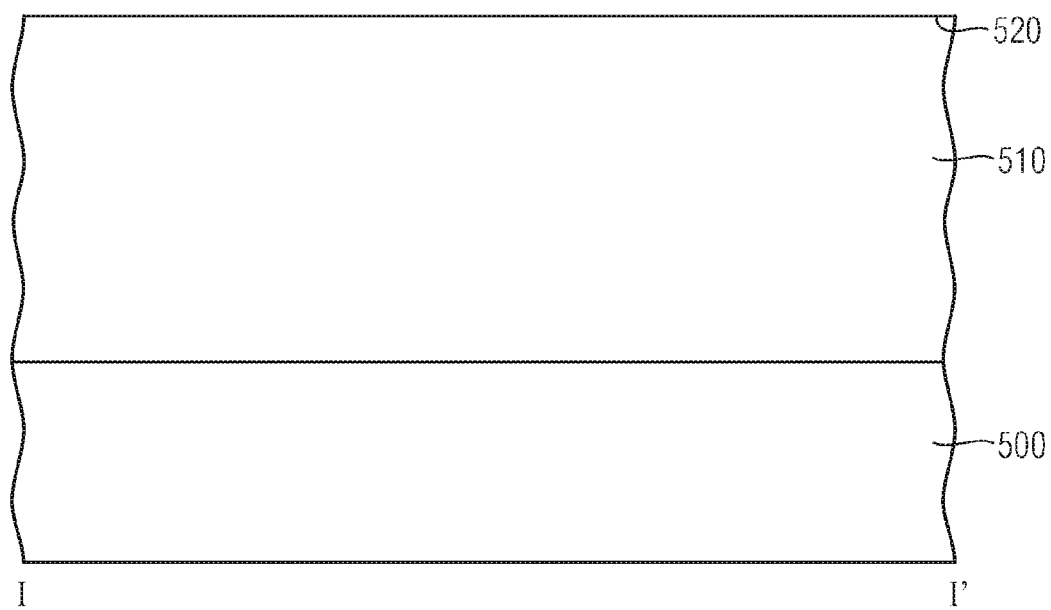
FIGS. 5A to 5H illustrate cross-sectional views and corresponding masks for illustrated a method for manufacturing a semiconductor device.

The starting point for performing the method according to an embodiment is a heavily doped wafer doped with dopants of the first conductivity type, for example, an n semiconductor wafer 500. A semiconductor layer of the first conductivity type, being doped at a lower doping concentration than the wafer 500, for example, an n− layer is epitaxially grown over the semiconductor wafer 500. FIG. 5A shows a cross-sectional view of an example of a resulting structure. A layer 510 of the first conductivity type at a lower doping concentration is formed over the wafer 500 of the first conductivity type having a higher doping concentration. The surface of the layer 510 forms the first main surface 520 of the resulting substrate.

Thereafter, several doping processes may be performed so as to provide well implantations. For example, these well implantations may define components of the first and second semiconductor devices 1, 3. Further, the implanted well portions may implement components of logic circuits which are to be formed in later or parallel processes.

Figure 5B:
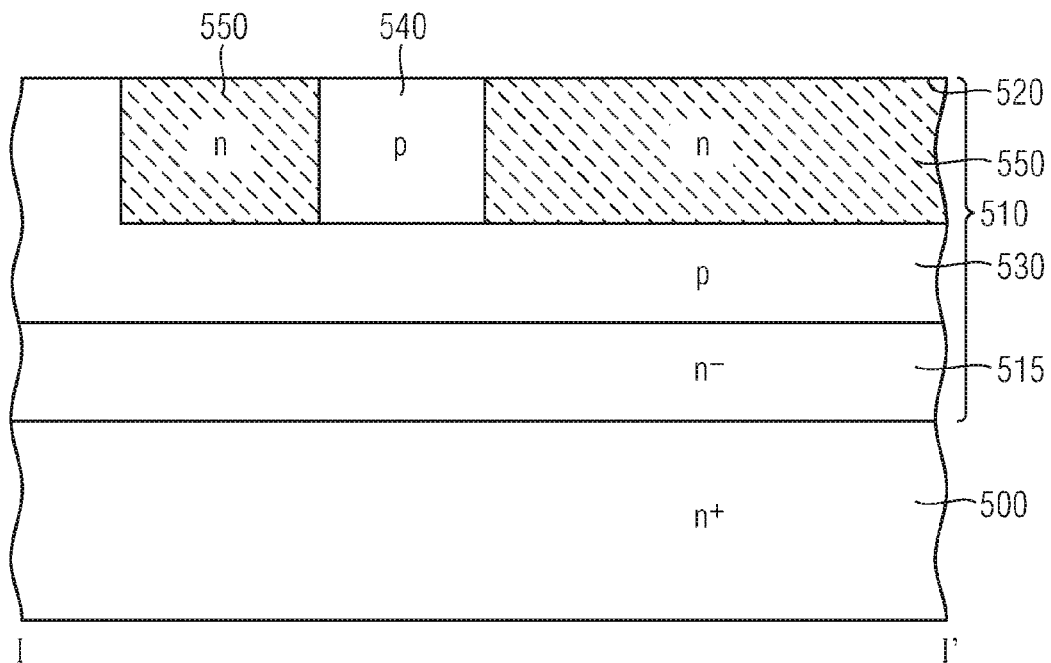

FIG. 5B shows an example of a resulting structure. As is shown in FIG. 5B, a layer 530 doped with dopants of the second conductivity type is disposed over a portion 515 of the layer 510 of the first conductivity type that is doped with a lower doping concentration. Further, portions 550 of the first conductivity type are disposed adjacent to the first main surface 520. The layer 530 provides a vertical isolation between the portion 515 and the portion 550 of the first conductivity type. In addition, portions 540 of the second conductivity type are disposed adjacent to the first main surface 520.

Figure 5C:
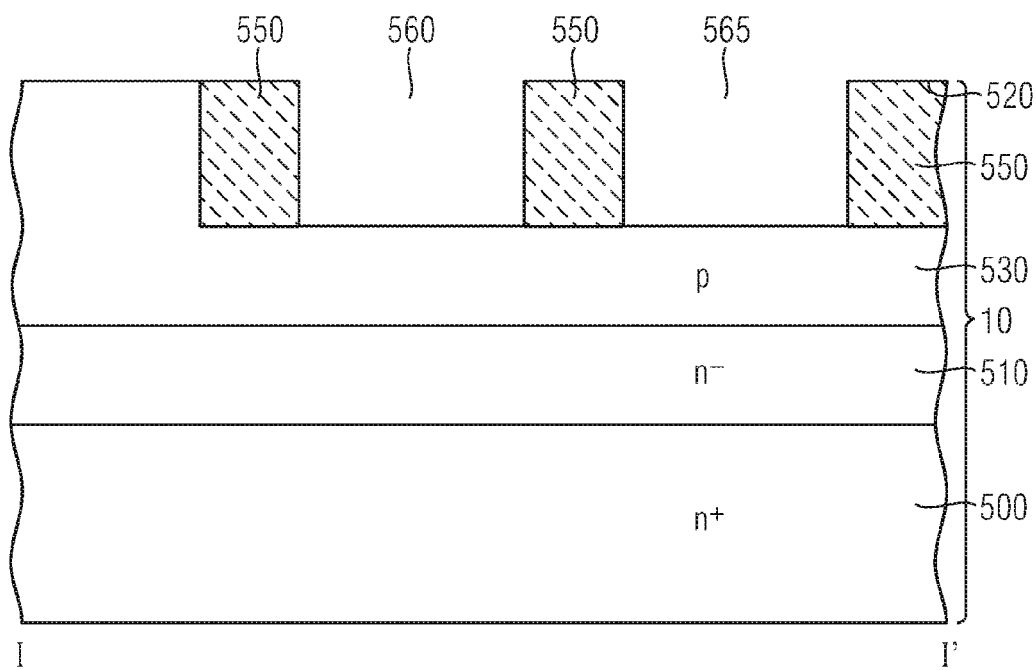
Figure 5D:
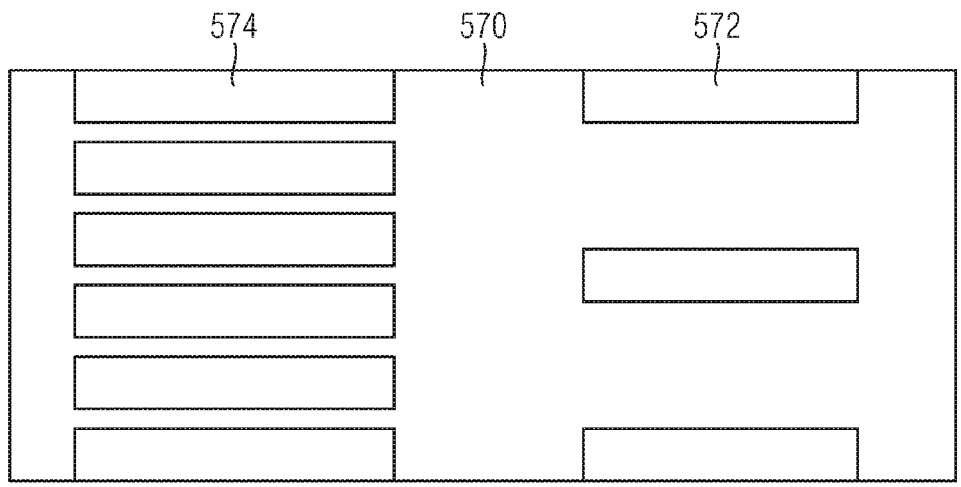

Thereafter, etching processes may be performed. According to an embodiment of a method of manufacturing an integrated circuit, masks may be employed for correspondingly processing components of the second semiconductor device 3. For example, the mask 570 shown in FIG. 5D may be used for forming openings 560, 565 in the first main surface 520 of the substrate 10 as shown in FIG. 5C in order to form the gate electrode 210 and the field plate 250. Further, also not explicitly shown in FIGS. 5C and 5D, the mask 570 may comprise openings for forming the isolation trenches 293. The mask 570 shown in FIG. 5D comprises openings 574 for defining the gate trenches 560 and openings 572 for defining the field plate trenches 565. Using the mask 570 shown in FIG. 5D, an etching process is performed so as to form the openings 560, 565. Thereafter, an insulating layer may be deposited, followed by the deposition of a conductive layer.

Figure 5E:
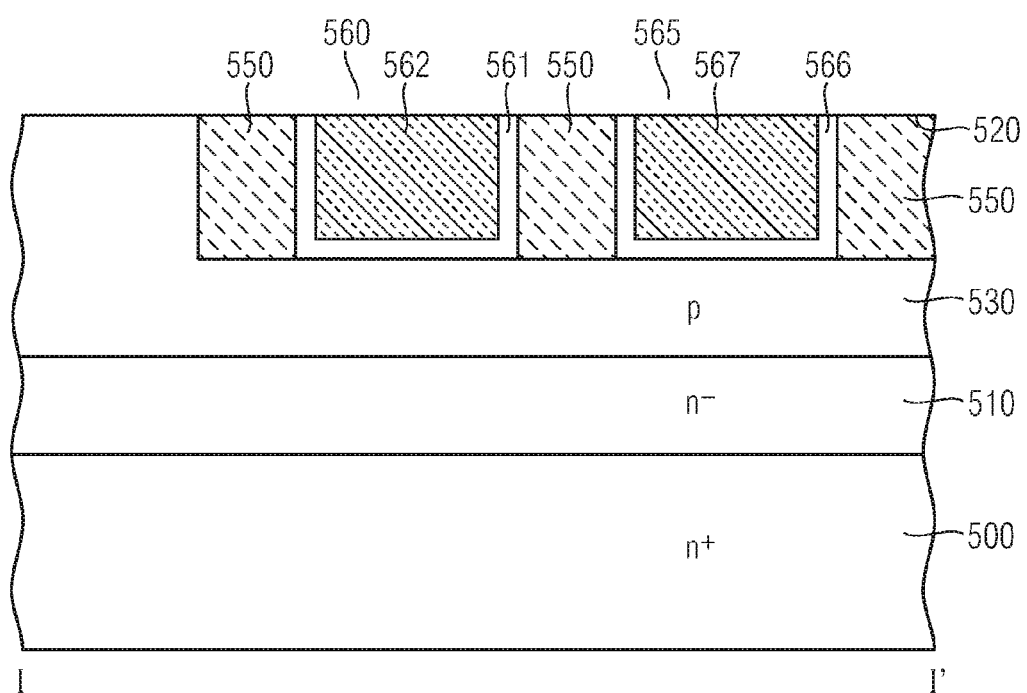

For example, as is also illustrated in FIG. 5E, a first insulating layer 561 may be formed in the first opening 560 and a second insulating layer 566 may be formed in the second opening 565. Further, a first conductive layer 562 may be formed in the first opening 560, and a second conductive layer 567 may be formed in the second opening 565. In a similar manner, an insulating layer and a conductive layer may be formed in the isolation trenches (not shown). The processes of forming the insulating layer and the conductive layer may be processing steps which form the field dielectric layer 407 and the field plate 405 shown in FIG. 4B, for example.

Figure 5F:
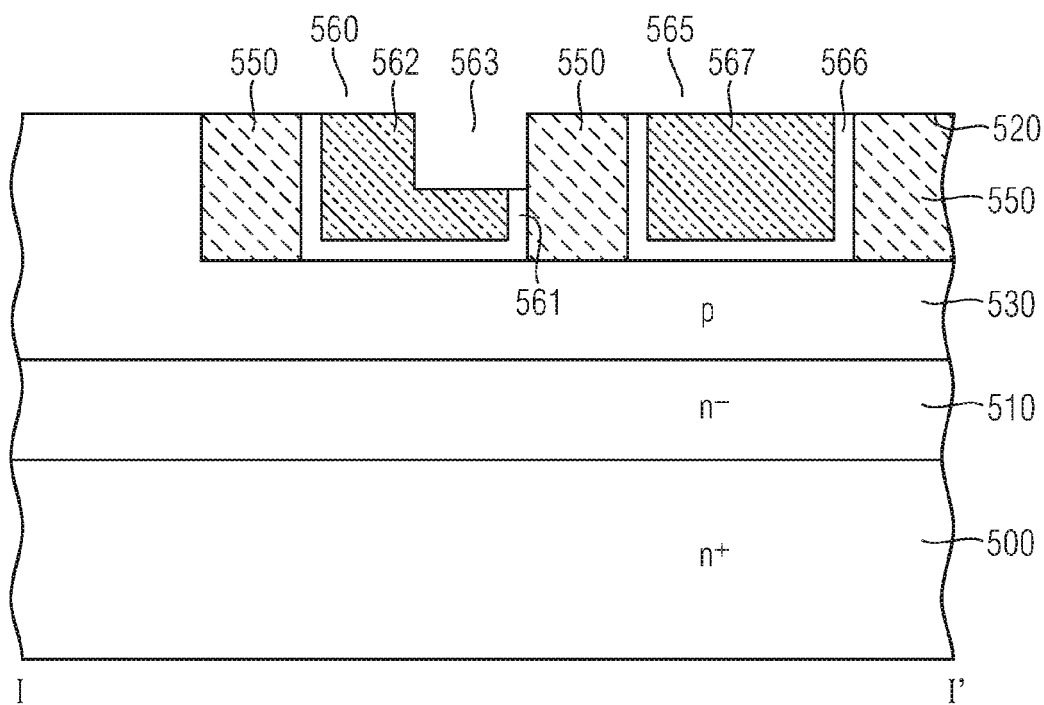
Figure 5G:
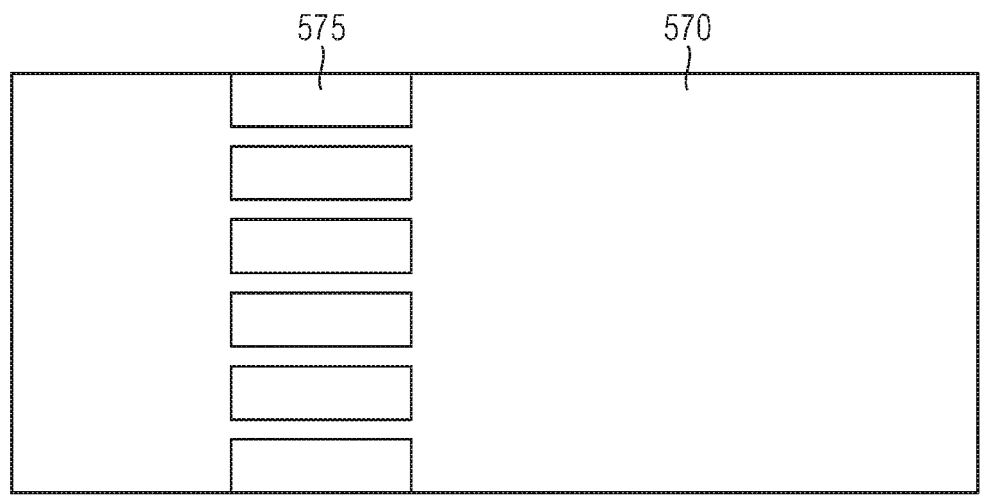

Thereafter, a further etching process is performed using the mask 570 that is, for example, shown in FIG. 5G. As is shown, the mask 570 shown in FIG. 5G comprises openings 575 which define the positions of the gate electrodes 210.

Figure 5H:
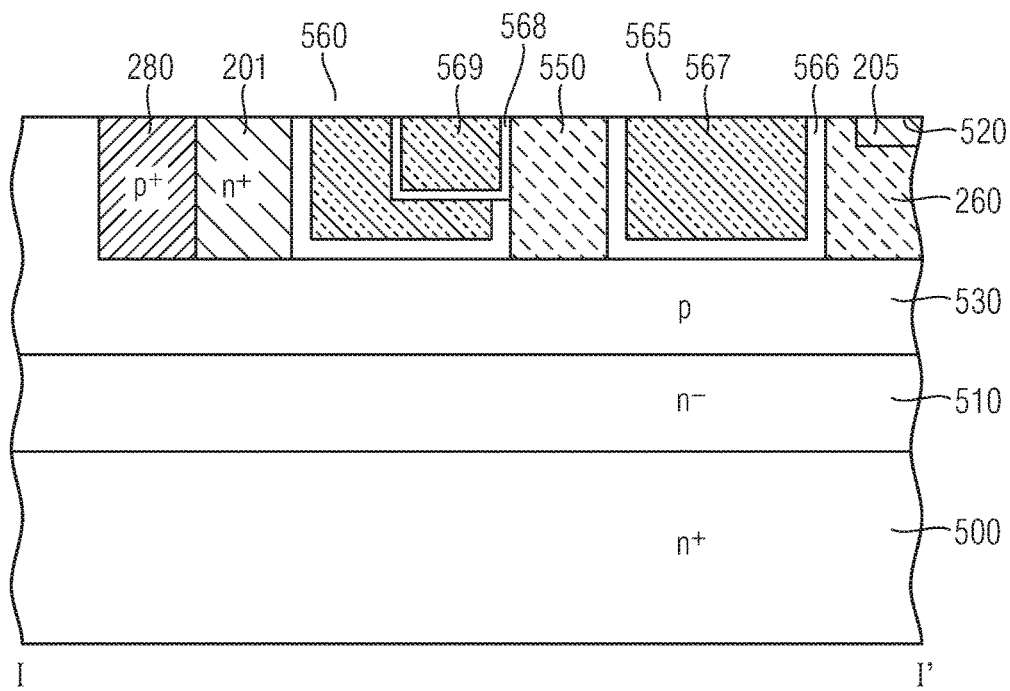

FIG. 5F shows an example of a resulting structure after performing a corresponding etching process. As is shown, openings 563 are formed in the conductive layer 562 and the insulating layer 561. Thereafter, a further process of forming an insulating layer followed by a conductive layer 569 is performed. Due to this processing step, a thin layer 568 is formed on the sidewalls and the bottom side of the openings 563, followed by a conductive filling 569. For example, this process may also form the gate dielectric layer 408 and the gate electrode 403 of the vertical transistor 35 illustrated in FIG. 4B. Further, doping processes may be performed in order to provide heavily doped portions of the source and drain regions 201, 205. FIG. 5H shows an example of a resulting structure.

Thereafter, further processing steps may be performed so as to provide further components of the first semiconductor device 1 and the second semiconductor device 3. For example, further insulating layers may be formed, followed by forming respective contacts to the components of the first and second semiconductor devices 1, 3.

Figure 6:
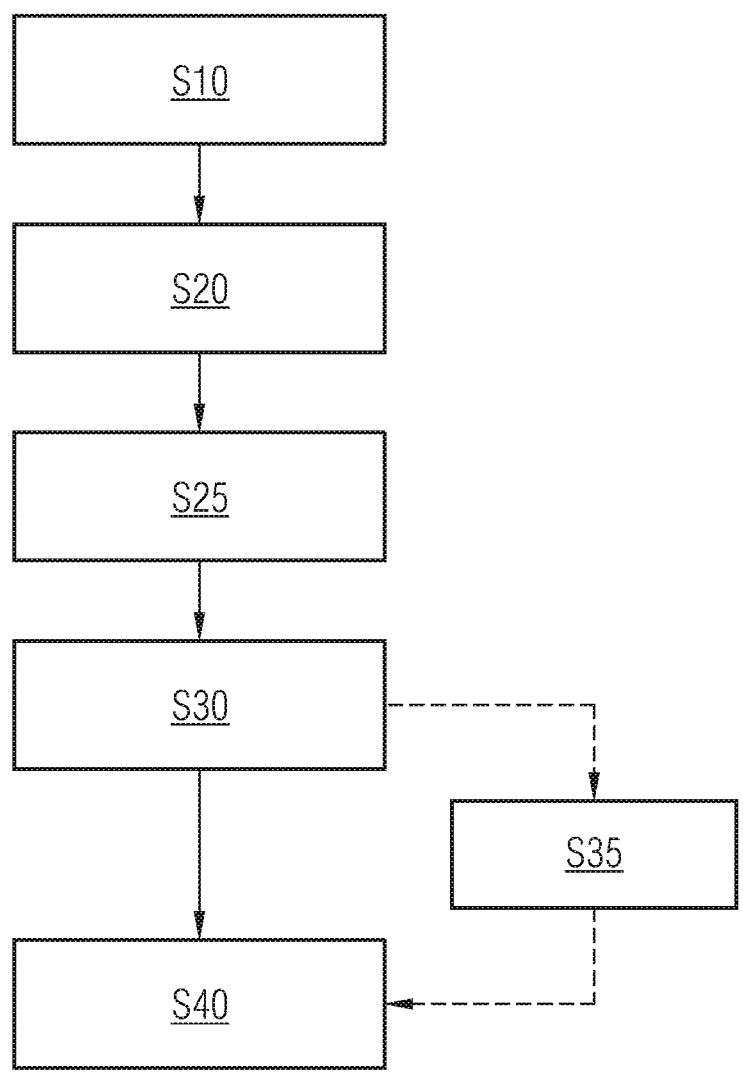
FIG. 6 shows a flow diagram of a method for manufacturing a semiconductor device.

FIG. 6 summarizes elements of the method of manufacturing a semiconductor device according to an embodiment. As is shown in FIG. 6, a method of manufacturing a semiconductor device includes forming a transistor in a semiconductor substrate having a first main surface. Forming the transistor comprises: forming a source region (S40); forming a drain region (S40); forming a channel region (S10); forming a drift zone (S20); and forming a gate electrode (S30) so as to extend in a first direction parallel to the first main surface adjacent to at least two sides of the channel region, the channel region and the drift zone being disposed along the first direction between the source region and the drain region. Forming the semiconductor device further includes forming a conductive layer (S25), a portion of the conductive layer being disposed in the semiconductor substrate beneath the gate electrode and being insulated from the gate electrode.

According to an embodiment, the method may further comprise forming trenches in the first main surface, wherein forming the portion of the conductive layer comprises forming a conductive material in the trenches. According to an embodiment, the method may further comprise etching back a portion of the conductive material in the trenches. For example, forming the gate electrode may comprise forming an insulating layer over the portion of the conductive layer, the insulating layer lining sidewalls of the trenches, and forming a gate conductive layer over the insulating layer. According to an embodiment, forming the semiconductor device may further comprise forming a field plate (S35).

Figure 7:
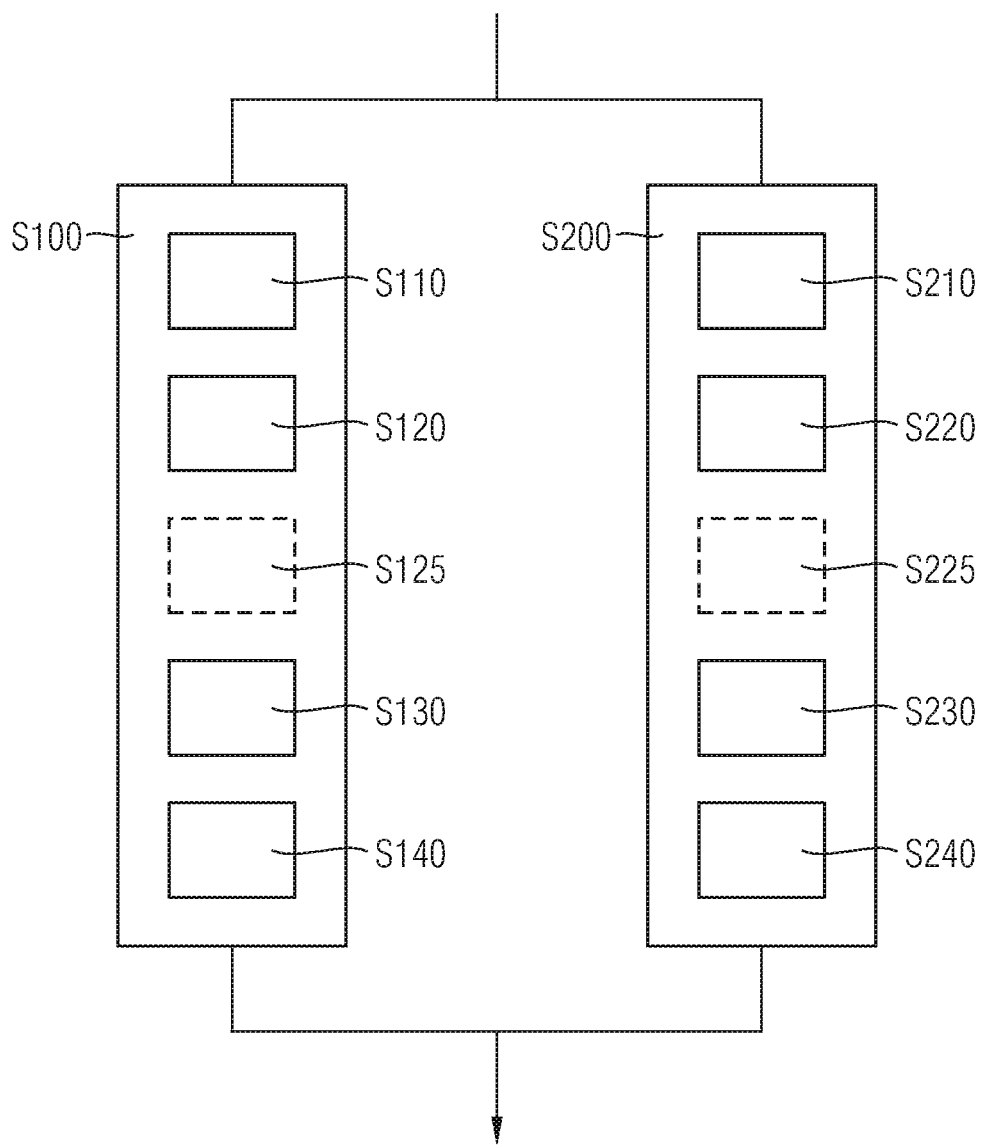
FIG. 7 shows a flow diagram of a method for manufacturing an integrated circuit according to an embodiment.

Further, FIG. 7 summarizes elements of a method of manufacturing an integrated circuit. As is shown, forming an integrated circuit may comprise forming a first transistor (S100) and forming a second transistor (S200) in a semiconductor substrate having a first main surface. Forming the first transistor may comprise: forming a first source region (S140); forming a first drain region (S140); forming a first channel region (S110); forming a first drift zone (S120); and forming a first gate electrode (S130) extending in a first direction parallel to the first main surface, the first gate electrode being formed so as to be disposed adjacent to at least two sides of the channel region. Forming the first channel region and forming the first drift zone may be accomplished so that they are disposed along the first direction between the first source region and the first drain region. Further, forming the second transistor (S200) comprises: forming a second source region (S240); forming a second drain region (S240); forming a second channel region (S210); forming a second drift zone (S220); and forming a second gate electrode (S230), wherein the second channel region and the second drift zone are disposed along a second direction between the second source region and the second drain region, the second drain region extending perpendicularly with respect to the first main surface. According to an embodiment, forming the first transistor (S100) may further comprise forming a conductive layer (S125), a portion of the conductive layer being disposed in the semiconductor substrate beneath the first gate electrode and being insulated from the first gate electrode. According to an embodiment, forming the second transistor (S200) may further include forming a second field plate (S225) so as to be arranged adjacent to the second drift zone.

According to an embodiment, the method may further comprise forming trenches in the first main surface, wherein forming the portion of the conductive layer comprises forming a conductive material in the trenches. According to an embodiment, the method may further comprise etching back a portion of the conductive material in the trenches. For example, forming the first gate electrode may comprise forming an insulating layer over the portion of the conductive layer, the insulating layer lining sidewalls of the trenches, and forming a gate conductive layer over the insulating layer.

According to an embodiment, forming the first semiconductor device may further comprise forming a first field plate.

According to an embodiment, elements of the first transistor and elements of the second transistor may be formed by joint processing processes. For example, forming the trenches for forming the first gate electrode and forming the trenches for forming the second gate electrode may comprise joint etching processes using different masks. Further, forming the conductive layer and forming the second field plate may comprise joint methods of forming a conductive layer. Further, forming the first gate electrode and forming the second gate electrode may comprise joint methods of forming a conductive layer.

While embodiments of the invention have been described above, it is obvious that further embodiments may be implemented. For example, further embodiments may comprise any subcombination of features recited in the claims or any subcombination of elements described in the examples given above. Accordingly, this spirit and scope of the appended claims should not be limited to the description of the embodiments contained herein.

What is claimed is:

1. A semiconductor device comprising a transistor in a semiconductor substrate having a first main surface, the transistor comprising:
 a source region;
 a drain region;
 a channel region;
 a drift zone; and
 a gate electrode adjacent to at least two sides of the channel region,
 wherein the channel region and the drift zone are disposed along a first direction parallel to the first main surface, between the source region and the drain region,
 wherein the semiconductor device further comprises an isolation trench that at least partially surrounds the transistor and an insulating material at sidewalls of the isolation trench and a conductive filling in the isolation trench.

2. The semiconductor device of claim 1, further comprising a field plate adjacent the drift zone.

3. The semiconductor device of claim 2, wherein the conductive filling of the isolation trench comprises a material of the field plate.

4. The semiconductor device of claim 1, wherein the channel region has a shape of a first ridge extending in the first direction.

5. The semiconductor device of claim 4, wherein a portion of the drift zone has a shape of a second ridge extending along the first direction.

6. The semiconductor device of claim 5, wherein the second ridge has a width different from a width of the first ridge.

7. The semiconductor device of claim 4, wherein a width d of the first ridge is: $d \leq 2 \times l_d$, wherein $l_d$ denotes a length of a depletion zone formed at an interface between the first ridge and the gate electrode.

8. The semiconductor device of claim 4, wherein $s/d > 2.0$, wherein s denotes a length of the first ridge measured along a first direction, and wherein d denotes a width of the first ridge.

9. A semiconductor device comprising a transistor in a semiconductor substrate having a first main surface, the transistor comprising:
   a source region;
   a drain region;
   a channel region;
   a drift zone; and
   gate trenches patterning the channel region into the shape of a ridge,
   wherein the channel region and the drift zone are disposed along a first direction parallel to the first main surface, between the source region and the drain region,
   wherein a longitudinal axis of the gate trenches extends in the first direction,
   wherein the semiconductor device further comprises an isolation trench that at least partially surrounds the transistor and a conductive filling in the isolation trench, the conductive filling comprising a material that is also arranged in the gate trenches.

10. The semiconductor device of claim 9, further comprising a field plate arranged adjacent to the drift zone, a material of the field plate being the same as the material of the conductive filling.

11. A method of manufacturing a semiconductor device including forming a transistor in a semiconductor substrate having a first main surface, wherein forming the transistor comprises:
   forming a source region;
   forming a drain region;
   forming a channel region;
   forming a drift zone; and
   forming gate trenches by patterning the channel region into the shape of a ridge, the channel region and the drift zone being disposed along a first direction parallel to the first main surface, between the source region and the drain region,
   wherein the gate trenches are formed so that a longitudinal axis of the gate trenches extends in the first direction, and
   wherein forming the semiconductor device further comprises forming an isolation trench so as to at least partially surround the transistor and forming a conductive filling in the isolation trench, the conductive filling comprising a material that is also filled in the gate trenches.

12. The method of claim 11, wherein forming the gate trenches comprises at least one process used when forming the isolation trench.

13. The method of claim 11, further comprising forming a field plate trench adjacent to the drift zone, wherein forming the field plate trench comprises at least one process used when forming the isolation trench.

14. The method of claim 12, wherein forming the conductive material in the isolation trench is performed by a process which also fills the conductive material in the gate trenches.

15. The method of claim 13, wherein forming the conductive material in the isolation trench is performed by a process which also fills the conductive material in the field plate trenches.

* * * * *